United States Patent [19]

Daly

[11] Patent Number: 5,231,298
[45] Date of Patent: Jul. 27, 1993

[54] GAAS DEVICE HAVING A STRAIN-FREE C-DOPED LAYER

[75] Inventor: James T. Daly, Mansfield, Mass.

[73] Assignee: Spire Corporation, Bedford, Mass.

[21] Appl. No.: 833,908

[22] Filed: Feb. 11, 1992

Related U.S. Application Data

[62] Division of Ser. No. 644,999, Jan. 24, 1991, Pat. No. 5,116,455.

[51] Int. Cl.$^5$ ............................................. H01L 29/161
[52] U.S. Cl. ................................. 257/191; 257/197; 257/609; 257/591
[58] Field of Search .................. 357/16, 34 HB, 63; 437/126, 976, 987, 81, 96, 133; 257/191, 197, 609, 591

[56] References Cited

U.S. PATENT DOCUMENTS

| | | | |
|---|---|---|---|
| 4,392,297 | 7/1983 | Little | 29/572 |
| 4,486,265 | 12/1984 | Little | 156/606 |
| 4,596,208 | 6/1986 | Wolfson et al. | 118/712 |
| 4,617,724 | 10/1986 | Yokoyama et al. | 437/13.3 |
| 4,741,354 | 5/1988 | Demild, Jr. | 137/240 |

OTHER PUBLICATIONS

M. L. Timmons, P. K. Chiang, S. V. Hattanyady "An Alternative Mg Porcursor for P-Type Doping of OMUPE Grown Material", *Journal of Crystal Growth* 77 (1986) pp. 37-41.

W. S. Hobson, S. J. Pearton, A. S. Jordan "Redistribution of 2n in GaAs-ALGaAs Heterojunction Bipolar Transistor Structures", *App. Phys. Lett.* 56(13) 26 Mar. 1990, pp. 1251-1253.

P. M. Enquist "P-type doping limit of Carbon in Organmetallic Vapor Phase Epitaxial Growth of GaAS Using Carbon Tetrachloride", *App. Phys. Lett.* 57(22) 26 Nov. 1990 pp. 2348-2350.

H. Ehrenreich, J. P. Hirth "Mechanism for Dislocation Density Reduction in GaAs Crystals by Indium Addition", *App. Phys. Lett.* 46(7) 1 Apr. 1985, pp. 668-670.

G. M. Blom, J. M. Woodall "Effect of Iso-Electronic Dopants on the Dislocation Density of GaAS", *Journal of Electronic Materials* vol. 17, No. 5, 1988 pp. 391-396.

G. B. Stringfellow, R. Stall, W. Koschel "Carbon in Molecular Beam Epitaxial GaAS"*App. Phys. Lett.* 38(3) Feb. 1981 pp. 156-157.

T. F. Kuech, M. A. Tischler, P. J. Wang, G. Scilla, R. Potenski, F. Cardone "Controlled Carbon Doping of GaAS by Metal . . .", *Appl. Phys. Lett.* 53(4) 3 Oct. 1988, pp. 1317-1319.

*Primary Examiner*—William Mintel
*Assistant Examiner*—Minhloan Tran
*Attorney, Agent, or Firm*—Morse, Altman, Dacey & Benson

[57] ABSTRACT

A device made by a process of making strain-free, heavily carbon-doped p-type epitaxial layers for use in high performance devices and at least one such device so made. The process essentially includes the epitaxial deposition of a strain-free, carbon-doped p-type layer in a GaAs HBT device to form the base layer thereof in a manner that includes the balancing of the strain of the crystal lattice structure caused by the carbon doping by co-doping the base layer with an isovalent and isoelectric dopant. The co-doping also improves device performance. It also effects alloy hardening, which inhibits further defect formation, improves mobility and carrier lifetime of the base layer and, by narrowing the energy gap, it improves ohmic contact formation.

3 Claims, 1 Drawing Sheet

GAAS DEVICE HAVING A STRAIN-FREE C-DOPED LAYER

This is a division of application Ser. No. 07/644,999, filed on Jan. 24, 1991, now U.S. Pat. No. 5,116,455.

BACKGROUND OF THE INVENTION

1. Field of the Invention

The present invention relates generally to the fabrication of high grade epitaxial layers and, more particularly, to a process of making strain-free, heavily carbon-doped III-V epitaxial layers and products so made.

2. The Prior Art

Semiconductors (also known as semiinsulators), in particular compound semiconductors, are formed in a variety of ways. One preferred way involves the metal-organic vapor phase epitaxy (MOVPE) based growing of semiconductors. Another preferred way involves the deposition of the semiconductor layers by molecular beam epitaxy (MBE). As known, a semiconductor is a solid crystalline material whose electrical conductivity is intermediate between that of a metal and an insulator and ranges from about $10^5$ mhos to about $10^{-7}$ mho per meter. A semiconductor usually is strongly temperature-dependent.

The several layers of a semiconductor device are either n-type or p-type, depending on their doping during deposition. A semiconductor device is one in which the characteristic distinguishing electronic conduction takes place within a semiconductor, that is the solid semiinsulating crystalline material. The n-type semiconductor layers are typically doped during their deposition with a dopant such as silicon (Si) or sulfur (S) in the range of about 0.1 to about 100 parts-permillion (ppm). A wide variety of p-type dopants have been used in the MOVPE based growth of semiconductors. The most common dopant elements include Zinc (Zn), magnesium (Mg) and beryllium (Be). However, the control over the dopant concentration and the dopant profile using one of these dopants has been difficult due to gas system "memory" effects and their relatively high diffusion coefficients. See M. L. Timmons et al, "An Alternative Mg Precursor For p-Type Doping of OMVPE Grown Material," *Journal of Crystal Growth* 77 (1986) pp. 37-41. See also W. S. Hobson et al, "Redistribution of Zn in GaAs-AlGaAs Heterojunction Bipolar Transistor Structures," *Applied Physics Letters*, 56 (1980) pp. 1251-1253. Workers in the field have, accordingly, investigated other p-type dopants, including carbon. Initially, the intentional introduction of carbon as a p-type dopant in epitaxy from a wide variety of hydrocarbon sources had been less than successful due to the low carbon content levels that could be achieved despite a wide variety and range of growth conditions employed. Toward the end of the 1980's, a group of workers have succeeded in achieving high levels of active carbon by using trimethylgallium [Ga(CH$_3$)$_3$] (TMGa) and arsine, AsH$_3$, in metalorganic molecular beam epitaxy (MOMBE). Others then succeeded in the controll-ed doping of GaAs layers in MOVPE growth through the combined use of trimethylarsenic [As(CH$_3$)$_3$] (TMAs) and arsine, AsH$_3$ and also by selecting the proper growth temperature during the TMGa-based growth of GaAs. See T. F. Kuech, et al., "Controlled Carbon Doping of GaAs by Metalorganic Vapor Phase Epitaxy," *Appl. Phys. Lett.* 53(14), 3 October 1988, pp. 1317-1319. See also P.M. Enquist, "P-Type Doping Limit of Carbon in Organometallic Vapor Phase Epitaxial Growth of GaAs Using Carbon Tetrachloride," *Appl. Phys. Lett.* 57(22), 26 November 1990, pp. 2348-2350; and G. B. Stringfellow et al, "Carbon in Molecular Beam Epitaxial GaAs," *Appl Phys Lett* 38 (3), 1 February 1981, pp. 156-157.

Using carbon as p-type dopant, the doping profile can be made extremely sharp. Further, since carbon in GaAs evinces a diffusion coefficient that is much lower than that of either Zn or Mg, carbon-doped GaAs layers have been found suitable for use as p$^-$-channel stop layers and also for high doping applications in high performance electronic devices. Such high performance electronic devices include super lattice structures, tunnel diodes, laser diodes and heterojunction biopolar transistors (HBTs). HBTs are currently being investigated by some workers in the field as potential replacements for field effect transistors (FETs) in certain high power, low noise applications due to their vertical geometry, higher individual layer conductivity and their proven lower 1/f noise.

In the epitaxial forming of GaAs layers, carbon is incorporated as a substitutional acceptor on the column V sublattice and is covalently bonded to four surrounding column III atoms. Since the typical Ga-C binding energy and bond length are slightly different than those for Ga-As, the substitution of carbon in the lattice results in a slight distortion of the crystal lattice structure. As the carbon concentration increases, so does the distortion and the macroscopic strain on the layer. At some point, the strain will become so great that it overcomes the shear strength of the material itself and begins to introduce native crystal defects, having a detrimental effect on device performance. A strengthening of GaAs single crystals by the substitution of a few percent indium on Ga sites has been observed and reported. See H. Ehrenreich et al, "Mechanism For Dislocation Density Reduction in GaAs Crystals by Indium Addition," *Appl Phys Lett* 46 (7), 1 Apr. 1985, pp. 668-670. And in the liquid encapsulation Czochralski (LEC) growth of GaAs, the addition of 1% indium has been reported to reduce the dislocation density in the resultant material. See G. M. Blom et al., "Effect of Iso-Electronic Dopants on the Dislocation Density of GaAs," *Journal of Electronic Materials*, Vol. 17 No. 5, 1988, pp. 391-396. No one to date has however so far addressed the balancing of distortion and strain of a heavily carbon-doped p-type epitaxial layer caused by the incorporation of carbon atoms therein.

SUMMARY OF THE INVENTION

It is a principal object of the present invention to overcome the above disadvantages by providing a process of making strain-free, heavily carbon-doped epitaxial layers for use in high-performance devices and devices so made.

More specifically, it is an object of the present invention to provide a process of epitaxially depositing strain-free, carbon-doped p$^+$-type GaAs layers so as to achieve a carbon content level of at least about $1 \times 10^{19}$ cm$^{-3}$ and co-doping it with an isovalent and isoelectronic dopant to strain the resultant lattice structure of the heavily carbon-doped GaAs layer in a direction opposite to that induced by the carbon-doping. Preferably, the carbon content level of the carbon-doped GaAs layer is about $1 \times 10^{20}$ cm$^{-3}$. Preferably, the isovalent and isoelectronic dopant is indium or antimony. The amount of co-dopant required to counteract the carbon-induced strain in the GaAs layer is proportional, but not equal, to the amount of carbon employed for p-doping the GaAs layer One such high performance device made according to the invention process is a heterojunction bipolar transistor having a base which is a strain-free, heavily carbon-doped p+-type GaAs layer co-doped with an isovalent, isoelectronic dopant to counteract the strain induced therein by the carbon-doping. The co-doping also improves the performance of the resultant device The co-doping further effects alloy hardening, which in turn inhibits further defect formation, improves mobility and carrier lifetime of the resultant base layer and, by reducing the energy gap, it also improves ohmic contact formation.

Other objects of the present invention will in part be obvious and will in part appear hereinafter.

The invention accordingly comprises the process and resultant product of the present disclosure, its component steps, parts and their interrelationships, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawings wherein.

DETAILED DESCRIPTION OF THE PREFERRED EMBODIMENT

In general, the present invention relates to an improved process of fabricating strain-free, heavily carbon-doped III-V material p-type epitaxial layers and high performance devices incorporating such strain-free layers.

As mentioned, the several layers of semiconductor devices are preferably formed, inter alia, either by molecular beam epitaxy (MBE) or by metalorganic vapor phase epitaxy (MOVPE). The terms "epitaxy" and "epitaxial growth" as used herein are intended to define the growth of one crystal on the surface of another crystal in which the growth of the deposited crystal is oriented by the lattice structure of the substrate. The term "epitaxial layer" as used herein is intended to define a semiconductor layer having the same crystalline orientation as the substrate on which it is grown.

The common assignee herein, Spire Corporation of Bedford, Mass., has been one of the pioneers in the field of epitaxially growing thin film, high efficiency solar cells, including those made from gallium arsenide (GaAs) films. See the U.S. Pat. Nos. 4,392,297 and 4,486,265 of Roger G. Little, respectively granted Jul. 12, 1983 and Dec. 4, 1984. The said common assignee herein, Spire Corporation of Bedford, Mass., also has been a pioneer in the design and construction of reaction chambers for use in OMVPE. See the U.S. Pat. No. 4,596,208 that issued Jun. 24, 1986 to Robert G. Wolfson et al, entitled CVD REACTION CHAMBER. In the epitaxial deposition field, some workers prefer to call the OMVPE technology as metalorganic chemical vapor deposition (MOCVD). An improvement in a critical component part of such a CVD reaction chamber designed for precisely mixing and accurately admitting a plurality of gases into the CVD reaction chamber is disclosed in a further U.S. Pat. No. 4,741,354 that issued May 3, 1988 to Leonard C. DeMild, Jr., entitled RADIAL GAS MANIFOLD, and also assigned to the said common assignee herein, Spire Corporation of Bedford, Mass. The disclosures of the said two U.S. Pat. Nos. 4,596,208 and 4,741,354 are incorporated herein by reference.

Figure 1:
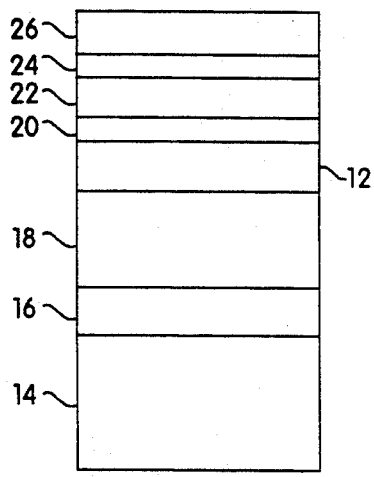
FIG. 1 is a schematic of a typical GaAs-based HBT device structure incorporating the present invention.

As mentioned, some of the high performance devices incorporating such strain-free, heavily carbon-doped p-type GaAs layers include superlattice structures, tunnel diodes, laser diodes and heterojunction bipolar transistors (HBTs). As also mentioned, HBTs presently are considered as potential replacements for field effect transistors (FETs) in certain power, low noise applications due, inter alia, to their vertical geometry, higher individual layer conductivity and their lower 1/f noise. A schematic of a typical GaAs-based HBT device structure 10 incorporating a strain-free, heavily carbon-doped p+-type GaAs epitaxial base layer 12 according to the invention is illustrated in FIG. 1. It is to be understood that each of the several layers comprising the device structure 10 is deposited either by MBE or, preferably by OMVPE, also referred to as MOCVD, and employing the CVD reaction chamber as disclosed in the said U.S. Pat. Nos. 4,596,208 and 4,741,354. These layers comprise a substrate 14 formed of low-grade GaAs, a buffer/contact layer 16 formed n+-type GaAs, a collector layer 18 formed of n--type GaAs, followed by the formation of the p+-type, strain-free, heavily carbon-doped base layer 12, an emitter grading layer 20 formed of AlGaAs, an emitter layer 22 formed of n-type AlGaAs, another emitter grading layer 24 formed of AlGaAs, and finally a contact layer 26 formed of n+-type GaAs.

Figure 2:
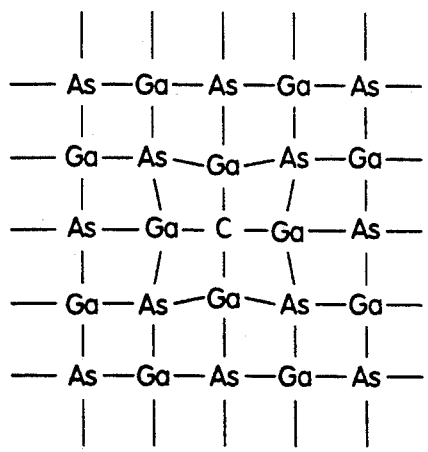
FIG. 2 is a schematic representation of a slight distortion in the crystal lattice structure of a GaAs layer induced by its being doped with carbon.

Preferably, the n-type layers of the HBT device 10 are doped either with silicon (Si) or sulfur (S). The GaAs base layer 12, however, is doped by carbon as the p+-type dopant so as to achieve a carbon content level therein of at least about $1 \times 10^{19} cm^{-3}$ and preferably about $1 \times 10^{20} cm^{-3}$. The base layer 12 also is co-doped with an isovalent and isoelectronic dopant to counter-strain the resultant lattice structure of the GaAs base layer 12, so as to render it strain free. The lattice structure of the GaAs carbon doped and co-doped base layer 12 is in turn determined, inter alia, by the lattice constant of the GaAs layer, as more fully described below The term "lattice constant" as used herein is intended to define a parameter defining the unit cell of a crystal lattice, i.e., the length of one of the edges of the cell or an angle between the edges of the cell. Usually, the lattice constant is expressed in Angstroms. The isovalent and isoelectronic co-dopant preferably is either indium (In) or antimony (Sb). The amount of the co-dopant required to be added to the GaAs layer in order to counter the strain induced therein by the heavy carbon doping thereof is proportional to, but not equal to, the amount of carbon doping, since each dopant strains the GaAs lattice structure at different rates, as more fully described below In FIG. 2 is illustrated a GaAs lattice structure 30 of the GaAs layer 12 slightly distorted by the incorporation therein of carbon (C) as a substitutional acceptor on the column-V sublattice and being covalently bonded to four surrounding column III atoms, i.e., gallium (Ga). The illustrated slight distortion in the GaAs crystal structure 30 due to this substitution of carbon in the lattice results from the fact that the typical Ga-C binding energy and bond length are slightly different from those of Ga-As.

Figure 3:
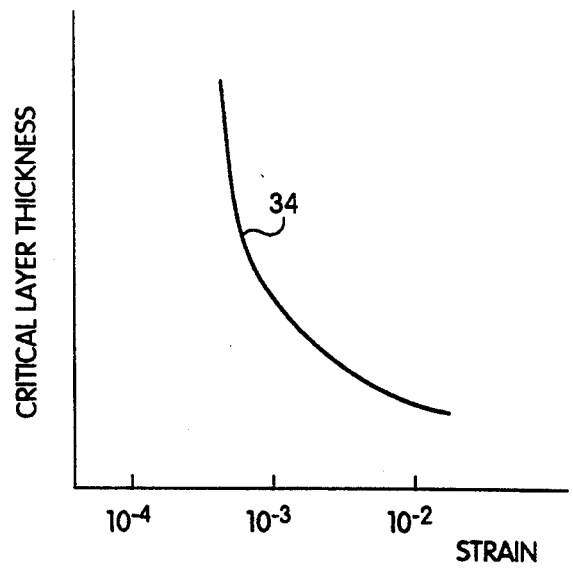
FIG. 3 depicts a curve plotting the critical layer thickness of a carbon-doped GaAs layer for the onset of crystal defects therein as a function of strain.

As the carbon concentration of the GaAs base layer 12 increases, so does the distortion and the macroscopic strain on the layer 12. At some point, the strain on the layer 12 will become so great that it overcomes the shear strength of the material itself and begins to introduce native crystal defects therein. FIG. 3 depicts a curve 34 plotting the critical layer thickness for the onset of native crystal defects in the GaAs base layer 12 as a function of strain. The stress will cause the formation of dislocations, i.e., native crystal defects, when the layer 12 becomes thick enough, that is to the right of the curve 34, with the dislocation free layer 12 being to the left thereof. The native crystal defects in turn will have a detrimental effect on device performance, i.e., the resultant HBT 10 will have lower gain. In case of another device, such as a laser diode (not shown), the laser diode will have a lower quantum efficiency due to these crystal defects.

Figure 4:
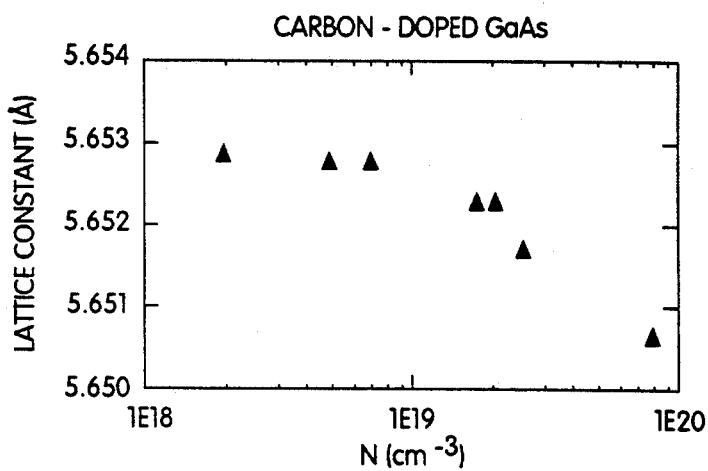
FIG. 4 illustrates the change in the lattice constant of a carbon-doped GaAs layer as a function of its carbon content level (N).

The change in the GaAs lattice constant due to the addition of carbon is illustrated in FIG. 4. FIG. 4 depicts this GaAs lattice constant change as a function of a carbon content level (N) of the carbon-doped GaAs layer. As may be observed, below about $5 \times 10^{18}$ cm$^{-3}$, the lattice constant of the carbon-doped GaAs is almost unchanged. However, above the $5 \times 10^{18}$ cm$^{-3}$ carbon content level, the lattice constant begins to decrease almost linearly.

The inventive process herein is intended to balance the distortion and strain of the crystal lattice of GaAs caused by the incorporation therein of the smaller carbon atom by co-doping it with another (isovalent) atom which is slightly larger than either gallium or arsenic and thus distorts the lattice in the opposite direction. Both indium (In) and antimony (Sb) are isoelectronic dopants in gallium arsenide and the addition of either acts to counter the strain induced by carbon incorporation. Further, since these dopants are isoelectronic, they do not significantly contribute to carrier concentration for compositions less than several percent.

Assuming $a_1$ to be the lattice constant of carbon-doped GaAs as given by FIG. 4 and that carbon-doping of GaAs follows Vegard's Law, the lattice constant thereof ($a_3$) will be defined by:

$$a_1 = a_{GaAs} - 2.09737 \cdot x_C \quad (1)$$

where $x_C$ is the mole fraction of carbon in the solid. This relation is based on a lattice constant of 3.5597 Angstroms for diamond.

As mentioned, the amount of indium or other isoelectronic dopant that would have to be added to counter the strain of the carbon would be proportional to, but not equal to, the amount of carbon added, since each dopant strains the GaAs lattice at different rates. The enlargement of the GaAs lattice ($a_2$) due to the addition of indium is linear and given by Vegard's law as:

$$a_2 = a_{GaAs} + 0.405 \cdot x_{In} \quad (2)$$

where $a_{GaAs}$ is the normal lattice constant of GaAs (5.6534 Å), $a_{InAs}$ is the normal lattice constant of InAs (6.05838 Å), $0.405 = a_{InAs} - a_{GaAs}$ and $x_{In}$ is the mole fraction of indium added to the solid.

The amount of indium that would be required to counteract the strain due to carbon is found from the equation:

$$a_3 = a_{GaAs} + 0.405 \cdot x_{In} - 2.09737 x_C \quad (3)$$

No strain requires $a_3 - a_{GaAs} = 0$, therefore:

$$a_3 - a_{GaAs} = 0 = x_{In} - \frac{2.09737}{0.405} \cdot x_C \quad (4)$$

Then the ratio of indium to carbon required to ensure that the lattice constant is always equal to that of GaAs is:

$$x_{In} = \frac{2.09737}{0.405} \cdot x_C = 5.170 \cdot x_C \quad (5)$$

where $x_C < 0.1$

A similar relationship holds if antimony (Sb) rather than indium is used to counterdope the carbon-doped GaAs layer, except that the coefficients will be:

$$x_{Sb} = \frac{2.09737}{0.442} \cdot x_C = 4.737 \cdot x_C \quad (6)$$

where $x_C \leq 0.1$ based on a lattice constant of 6.0854 Å for gallium antimonide (GaSb).

EXAMPLE I

In a GaAs layer, carbon-doped to a level of about $1 \times 10^{20}$ cm$^{-3}$ ($x_C \approx 0.0045$), the following amount of indium ($x_{In}$) has been added to counteract the strain due to the carbon content:

$$x_{In} = \frac{2.09737}{0.405} \cdot x_C$$

$$x_{In} = 0.0235$$

EXAMPLE II

In a GaAs layer, carbon-doped to a level of about $1 \times 10^{20}$ cm$^{-3}$ ($x_C$ 0.0045), the following amount of antimony ($x_{Sb}$) has been added to counteract the strain due to the carbon content:

$$x_{Sb} = \frac{2.09737}{0.405} \cdot x_C$$

$$x_{Sb} = 0.0216$$

Thus it has been shown and described a process of fabricating strain-free, heavily carbon-doped p-type epitaxial layers for use in high performance devices and devices so made, which process and product satisfy the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. In an epitaxially formed high performance GaAs device comprising a collector, a base and an emitter, the improvement wherein; said base is a strain-free, carbon doped $p^+$-type GaAs layer, said layer co-doped with an indium isovalent, isoelectronic dopant to strain a resultant lattice structure thereof in a direction opposite to that induced by said carbon doping, wherein the amount of said indium co-dopant to counteract the strain due to said carbon-doping is derived from the following equation:

$$x_{In} = \frac{a_{GaAs} - a_1}{0.405}$$

where $a_{GaAs}$ is the normal lattice constant of GaAs (5.6534 A), $a_1$ is the lattice constant of carbon doped GaAs, and $x_{In}$ is the mole fraction of indium required to be added to said carbon-doped GaAs layer; wherein the counteraction of the strain due to the addition of said indium co-dopant is given by Vegard's law as $a_2 = a_{GaAs} + 0.405 \cdot x_{In}$ where $a_2$ is the lattice constant of the GaAs lattice due to the addition of indium; and wherein the lattice constant ($a_1$) of said carbon-doped GaAs layer is derived from the formula $a_1 = a_{GaAs} - 2.0937 \cdot x_C$ where $x_C$ is the mole fraction of carbon in the solid, based on a lattice constant of 3.5597 A for diamond.

2. In an epitaxially formed high performance GaAs device comprising a collector, a base and an emitter, the improvement wherein; said base is a strain-free, carbon doped $p^+$-type GaAs layer, said layer co-doped with an indium isovalent, isoelectronic dopant to strain a resultant lattice structure thereof in a direction opposite to that induced by said carbon doping, wherein the amount of said indium co-dopant to the amount of carbon dopant is:

$$x_{In} = \frac{2.09737}{0.405} \cdot x_C = 5.170 \cdot x_C,$$

where $x_C$ is about 0.1.

3. In an epitaxially formed high performance GaAs device comprising a collector, a base and an emitter, the improvement wherein; said base is a strain-free, carbon doped $p^+$-type GaAs layer, said layer co-doped with an antimony isovalent, isoelectronic dopant to strain a resultant lattice structure thereof in a direction opposite to that induced by said carbon doping, wherein the amount of said antimony co-dopant to the amount of carbon dopant is:

$$x_{Sb} = \frac{2.09737}{0.442} \cdot x_C = 4.737 \cdot x_C,$$

where $x_C$ is about 0.1, and where a lattice constant for gallium antimonide (GaSb) is 6.0954 Å.

* * * * *

UNITED STATES PATENT OFFICE
CERTIFICATE OF CORRECTION

PATENT NO. : 5,231,298
DATED : July 27, 1993
INVENTOR(S) : James T. Daly

It is certified that error appears in the above-identified patent and that said Letters Patent is hereby corrected as shown below:

The title [54] on both the title page and in line 1, column 1, is to read as follows:

"GaAs DEVICE HAVING A STRAIN-FREE C-DOPED LAYER"

Signed and Sealed this

Twenty-fourth Day of May, 1994

Attest:

BRUCE LEHMAN

*Attesting Officer*  *Commissioner of Patents and Trademarks*